(12) United States Patent
Hargreaves

(10) Patent No.: US 11,004,883 B2
(45) Date of Patent: May 11, 2021

(54) SYSTEM AND METHOD FOR OPTICAL SENSING

(71) Applicant: SYNAPTICS INCORPORATED, San Jose, CA (US)

(72) Inventor: Kirk Hargreaves, Mountain View, CA (US)

(73) Assignee: Synaptics Incorporated, San Jose, CA (US)

( * ) Notice: Subject to any disclaimer, the term of this patent is extended or adjusted under 35 U.S.C. 154(b) by 113 days.

(21) Appl. No.: 16/375,502

(22) Filed: Apr. 4, 2019

(65) Prior Publication Data
US 2020/0321377 A1 Oct. 8, 2020

(51) Int. Cl.
*H01L 27/146* (2006.01)
*G01N 21/90* (2006.01)

(52) U.S. Cl.
CPC ... *H01L 27/14625* (2013.01); *G01N 21/9036* (2013.01); *H01L 27/14609* (2013.01)

(58) Field of Classification Search
CPC ........ H01L 27/14625; H01L 27/14609; G01N 21/9036
See application file for complete search history.

(56) References Cited

U.S. PATENT DOCUMENTS

| | | | | |
|---|---|---|---|---|
| 3,904,922 A * | 9/1975 | Webb | ................ | H05B 41/3922 315/151 |
| 5,621,205 A * | 4/1997 | Warner | ..................... | G01J 1/32 250/205 |
| 10,228,797 B2 * | 3/2019 | Roberson | ................ | G06F 3/044 |
| 2005/0218299 A1 * | 10/2005 | Olsen | ...................... | H03F 3/087 250/214 A |
| 2008/0230684 A1 * | 9/2008 | Chew | ................... | H03G 3/3084 250/214 AG |
| 2009/0213165 A1 * | 8/2009 | Burke | ..................... | B41J 11/009 347/19 |
| 2010/0065720 A1 * | 3/2010 | Raynor | ................... | H03F 3/087 250/201.1 |
| 2010/0087718 A1 * | 4/2010 | Gonopolskiy | ..... | A61B 5/14551 600/323 |
| 2010/0215122 A1 * | 8/2010 | Nihei | ..................... | H03K 5/084 375/316 |
| 2012/0141122 A1 * | 6/2012 | Carusone | ........... | H04B 10/6971 398/37 |
| 2014/0323844 A1 * | 10/2014 | Deliwala | ........... | H01L 31/02016 600/407 |

(Continued)

*Primary Examiner* — John R Lee
(74) *Attorney, Agent, or Firm* — Ferguson Braswell Fraser Kubasta PC

(57) ABSTRACT

A processing system for an optical sensing device may comprise receiver circuitry and a determination module. The processing system may also include drive circuitry configured to drive a light source to emit light. The receiver circuitry is coupled to a photodetector, and the receiver circuitry is configured to acquire a resulting signal from the photodetector, and generate a measurement of light received by the photodetector based on the resulting signal. The receiver circuitry includes high-pass filter circuitry configured to high-pass filter the resulting signal to generate a high-pass filtered signal based. The determination module is configured to generate a light measurement based on the high-pass filtered signal.

20 Claims, 8 Drawing Sheets

(56) References Cited

U.S. PATENT DOCUMENTS

| | | | |
|---|---|---|---|
| 2015/0145764 A1* | 5/2015 | Hiromi | G01S 17/36 |
| | | | 345/156 |
| 2016/0025777 A1* | 1/2016 | Deliwala | A61B 5/02427 |
| | | | 324/115 |
| 2016/0161610 A1* | 6/2016 | Hiromi | G01S 17/36 |
| | | | 250/341.8 |
| 2016/0274226 A1* | 9/2016 | Lewis | G01S 7/4865 |
| 2018/0033814 A1* | 2/2018 | Chalmers, Jr. | H01L 27/14601 |
| 2018/0033815 A1* | 2/2018 | Chalmers, Jr. | G01J 1/44 |
| 2019/0353517 A1* | 11/2019 | Abdelhafez | G01J 1/0411 |
| 2020/0178865 A1* | 6/2020 | Trattler | A61B 5/14552 |
| 2020/0210673 A1* | 7/2020 | Krah | H04N 5/3575 |
| 2020/0225370 A1* | 7/2020 | Viswanath | A61B 6/032 |
| 2020/0260970 A1* | 8/2020 | Pickett | A61B 5/02416 |

* cited by examiner

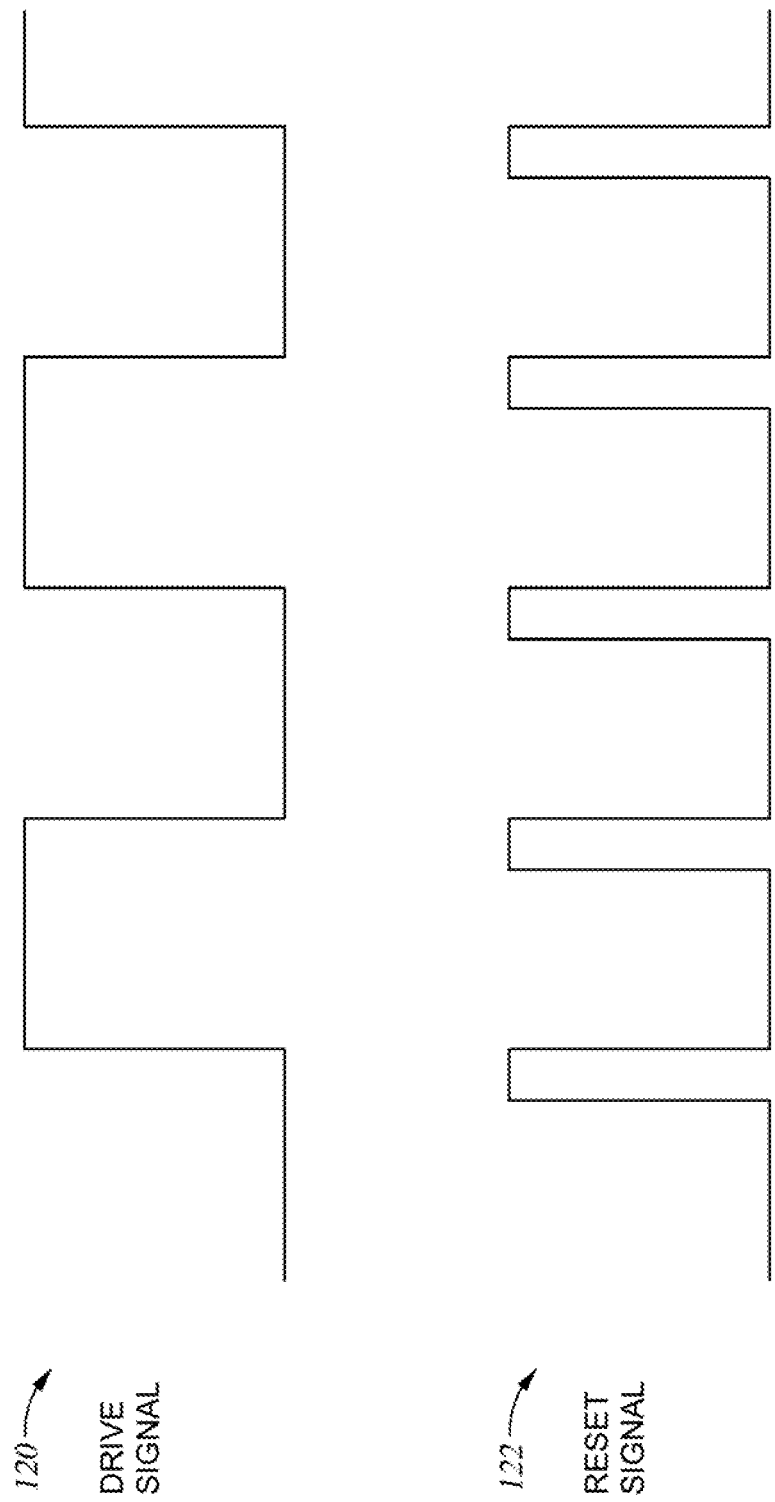

SYSTEM AND METHOD FOR OPTICAL SENSING

BACKGROUND

Field

The disclosure herein is generally related to electronic devices, and more specifically, to optical sensing devices.

Description of the Related Art

Input devices including proximity sensor devices may be used in a variety of electronic systems. A proximity sensor device may include a sensing region in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads or optical sensing devices integrated in, or peripheral to, notebook or desktop computers and multimedia entertainment centers of automobiles. Proximity sensor devices may also often be used in smaller computing systems, such as touch screens or optical sensing devices of cellular phones.

SUMMARY

In one embodiment, a processing system for an optical sensing device comprises receiver circuitry configured to receive a resulting signal from a photodetector. The resulting signal corresponds to light emitted by a light source in response to being driven with a drive signal. The receiver circuitry comprises high-pass filter circuitry and a determination module. The high-pass filter circuitry is configured to generate a high-pass filtered signal based on the resulting signal and the high-pass filter circuitry comprises an input capacitor, a feedback capacitor, and a reset switch. The reset switch is configured to reset the feedback capacitor at least partially based on a reset signal having a frequency corresponding to a frequency of the drive signal. The determination module is configured to generate a first light measurement based on the high-pass filtered signal.

In one embodiment, a method for operating an optical sensor comprises generating, with a photodetector, a resulting signal corresponding to light emitted by a light source in response to a drive signal. The method further comprises high-pass filtering, with high-pass filter circuitry, the resulting signal to generate a high-pass filtered signal, selectively operating a reset switch to reset a feedback capacitor of the high-pass filter circuitry at least partially based on a reset signal having a frequency corresponding to a frequency of the drive signal, and generating a light measurement based on the high-pass filtered signal.

In one embodiment, an optical sensing device comprises a light source, a photodetector, and a processing system. The processing system is coupled to the light source and the photodetector and comprises driver circuitry and receiver circuitry. The driver circuitry is configured to drive the light source with a drive signal to emit light. The receiver circuitry is configured to receive a resulting signal from the photodetector, the resulting signal corresponding to the light emitted by the light source. The receiver circuitry comprises high-pass filter circuitry and a determination module. The high-pass filter circuitry is configured to generate a high-pass filtered signal based on the resulting signal. The high-pass filter circuitry comprises an input capacitor, a feedback capacitor, and a reset switch configured to reset the feedback capacitor at least partially based on a reset signal having a frequency corresponding to a frequency of the drive signal. The determination module is configured to generate a light measurement based on the high-pass filtered signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 1B illustrates signal traces, according to one or more embodiments.

Figure 1A:
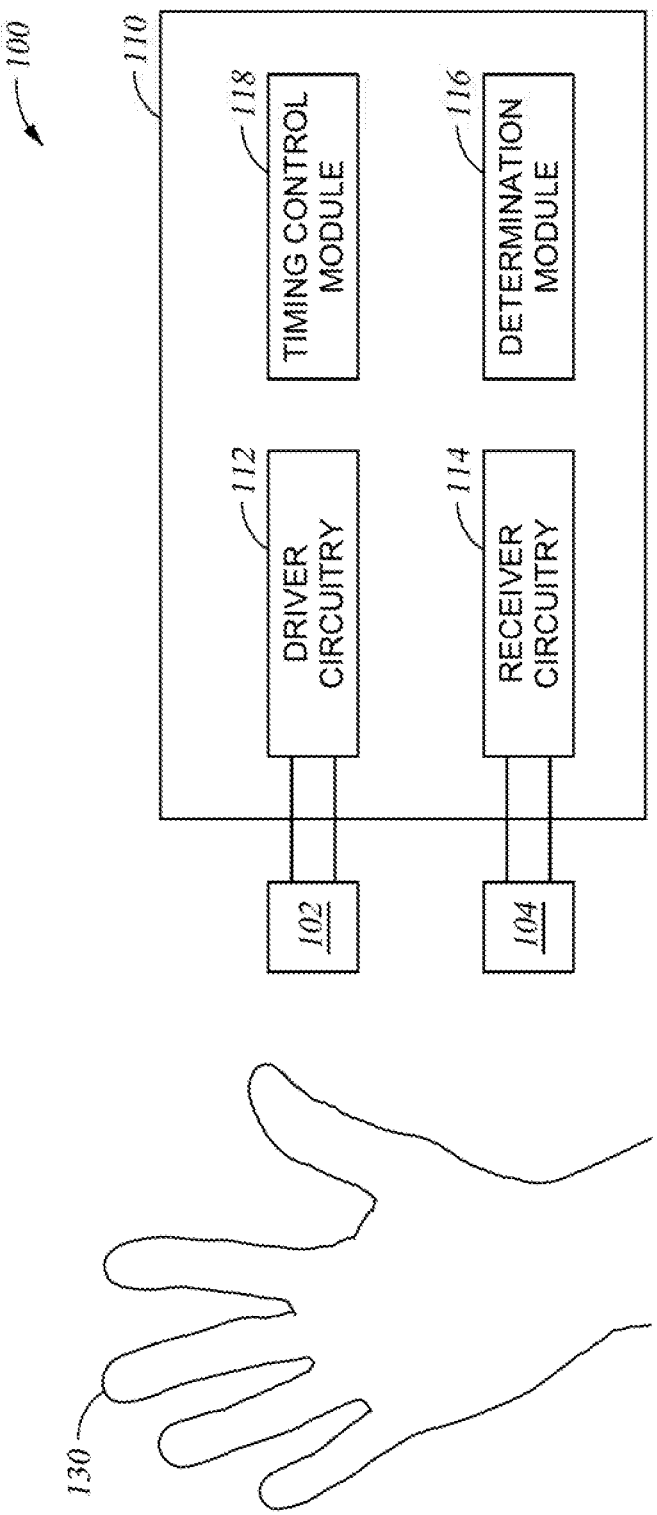
FIG. 1A is a schematic block diagram of an optical sensing device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

FIG. 1A illustrates an optical sensing device 100, according to one or more embodiments. The optical sensing device 100 includes a processing system 110, a light source 102 and a photodetector 104. In one or more embodiments, the optical sensing device 100 is able to sense light emitted by light source 102 in the presence of large amounts of ambient light. For example, optical sensing device 100 may be configured to sense light emitted by light source 102 in the presence of full sunlight.

The light source 102 may be any device suitable for emitting modulated light. For example, the light source 102 may be one or more light emitting diodes (LEDs) or one or more organic light emitting diodes (OLEDs), among others. Further, the light source 102 may be configured to emit light within one or more range of wavelengths. For example, the light source 102 may be configured to emit light corresponding to infrared (IR) light having wavelengths in the range of about 700 nm to about 1 mm. Further, the light source 102 may be configured to emit light corresponding to visible light having wavelengths in a range of about 400 nm to about 700 nm. Additionally, or alternatively, the light source 102 may be configured to emit light corresponding to ultraviolet light with wavelengths shorter than about 400 nm. In one embodiment, the light source 102 emits light in response to being driven with a drive signal. In one or more embodiments, the drive signal is a current signal. Further, the drive signal may be a varying current signal.

FIG. 1B illustrates an example drive signal, drive signal 120. In one or more embodiments, the drive signal 120 includes a varying current signal having a number of pulses. Further, the light source 102 may be turned on and emit light in response to a high level of the drive signal 120 and may be turned off and stop emitting light in response to a low level of the drive signal 120. Additionally, the time between rising and falling edges of the drive signal may be referred to as a drive period of the drive signal 120. Further, while FIG. 1B illustrates the drive signal 120 as being a square wave, in other embodiments, the drive signal 120 may be an offset sine wave, or a direct sequence spread spectrum (DSSS) signal, among others.

In various embodiments, the light emitted by the light source 102 is reflected by an input object 130. The input object 130 may be one or parts of a user. For example, the input object 130 may be one or more fingers of a user, a palm of a user, or a hand of a user, among others.

The photodetector 104 may be any device configured to generate a resulting signal in response to received light. Further, generating a resulting signal may comprise converting received light into a current signal. In one or more embodiments, the photodetector 104 may be a photodiode or a photo-transistor, among others. The photodetector 104 may be configured to receive at least one of IR light, visible light and ultraviolet light. In various embodiments, the photodetector 104 may receive light emitted by the light source 102 and reflected by the input object 130 and generate a resulting signal comprising effects corresponding to the amount of light received by the photodetector 104. In one embodiment, the resulting signal may additionally comprise effects corresponding to ambient light. The resulting signal may be a current signal and the level of the current signal may correspond to the amount of the light emitted by light source 102 that is reflected by the input object 130 and is received by the photodetector 104.

The processing system 110 is coupled to the light source 102 and the photodetector 104. Further, the processing system 110 may drive the light source 102 with a drive signal, e.g., drive signal 120, and receive a resulting signal from the photodetector 104. The processing system 110 may generate a measurement of the reflected light based on the resulting signal. For example, the processing system 110 may measure the resulting signal to generate a measurement of the light that is reflected by the input object 130.

The processing system 110 may include one or more of driver circuitry 112, receiver circuitry 114, a determination module 116, and a timing control module 118. The driver circuitry 112 is coupled to the light source 102 and is configured to drive the light source 102 with a drive signal, e.g., drive signal 120, to cause the light source 102 to emit light. In one embodiment, the driver circuitry 112 is coupled with the timing control module 118 and drives the light source 102 with a drive signal based on a timing signal received from the timing control module 118. For example, the timing signal may define the frequency of the drive signal. The frequency of the drive signal may be in a range of about 10 kHz to 500 kHz. In other embodiments, frequencies less than 10 kHz and/or frequencies above 500 kHz may be utilized. In one or more embodiments, the frequency of the drive signal is constant. In other embodiments, the frequency of the drive signal is variable. Further, the timing signal may define at least one of the duty cycle, amplitude, shape, and start and end times of the drive signal.

The driver circuitry 112 includes circuitry configured to output the drive signal. For example the driver circuitry 112 may include one or more transistors, one or more capacitors, one or more resistors, and/or one or more amplifiers, among others. In one or more embodiments, a current driver may be coupled between the light source 102 and the driver circuitry 112. The current driver may be internal to or external to the processing system 110.

The receiver circuitry 114 is coupled to the photodetector 104 and is configured to receive a resulting signal from the photodetector 104 and generate a processed resulting signal. The receiver circuitry 114 may include amplifier circuitry configured to condition the resulting signal. In one embodiment, one or more portions of the receiver circuitry 114 functions as a high pass filter having a peak at the frequency of the drive signal.

The receiver circuitry 114 may also include demodulation circuitry configured to demodulate the resulting signal. For example, the demodulation circuitry may include a demodulator and/or a low pass filter. Alternatively, or additionally, the receiver circuitry 114 includes an analog-to-digital converter (ADC) configured to convert the resulting signal from an analog domain to a digital domain.

The receiver circuitry 114 may be coupled with the timing control module 118. In one embodiment, the receiver circuitry 114 receives one or more of a reset signal and a demodulation signal from the timing control module 118. The reset signal may be based on the drive signal. For example, the frequency of the reset signal may be based on the frequency of the drive signal. FIG. 1B illustrates an example reset signal 122. In one embodiment, the reset signal 122 has a frequency that is at least twice the frequency of the drive signal 120. For example, the reset signal 122 may have a frequency that is twice the frequency of the drive signal 120. Further, the frequency of the reset signal 122 may be twice an odd sub-harmonic of the drive signal 120. In other embodiments, other frequencies may be utilized. Further, the demodulation signal may be synchronous with the drive signal 120.

In various embodiments, the reset signal 122 includes a number of pulses. Each falling edge of each pulse of the reset signal 122 may occur before one of a rising edge of a pulse of the drive signal 120 and a falling edge of a pulse of the drive signal 120. One or more elements of the receiver circuitry 114 may be reset based on the rising edges of the reset signal 122. For example, the receiver circuitry 114 may include a feedback capacitor and resetting the receiver circuitry 114 may include discharging the feedback capacitor. Further, one or more elements of the receiver circuitry 114 may be reset based on the rising edges of the reset signal 122 such that the one or more elements of the receiver circuitry 114 is reset before a drive period of the drive signal 120.

The determination module 116 is coupled with the receiver circuitry 114. In one embodiment, the determination module 116 receives a processed resulting signal from the receiver circuitry 114 and determines a measurement of the light received by the photodetector 104. In one embodiment, the determination module 116 is configured to determine presence of the input object 130 based on the measurement of the light received by the photodetector 104. For example, the determination module 116 may be configured to compare the measurement of the received light to one or more thresholds to determine the presence of the input object 130. A single threshold or multiple thresholds may be utilized. For example, the determination module 116 may compare the measurement of the received light to a first threshold and if the measurement meets and/or exceeds the first threshold, a determination that the input object 130 is present may be determined. Determining that the input object 130 is present may correspond to determining that the input object 130 is within a predetermined distance from the optical sensing device 100. Further, additional thresholds may be utilized, where each threshold corresponds to a different distance from the optical sensing device 100. Further, in one more embodiments, the level of the measured received light may correspond to at least one of a size of the input object 130 and distance of the input object 130 from the optical sensing device 100. For example, larger input objects may reflect more light than smaller input objects and input objects closer to the optical sensing device 100 may reflect more light than input objects further away from the optical sensing device 100.

In various embodiments, the determination module 116 is configured to compare the processed resulting signal to a baseline. The baseline may be determined by acquiring a resulting signal with the photodetector 104 while the light source 102 is not emitting light. The baseline may correspond to a measurement of any offsets within the receiver circuitry 114. In one embodiment a baseline may be acquired before each light measurement is acquired. In other embodiments, a baseline may be acquired once every X number of light measurements, where X is greater than 1. Further, a baseline may be acquired after a predetermined amount of time has expired. For example, a baseline may be acquired once every 1 ms or more.

The timing control module 118 is coupled with one or more of the driver circuitry 112, the receiver circuitry 114, and the determination module 116. In one embodiment, the timing control module 118 is coupled with each of the driver circuitry 112, the receiver circuitry 114, and the determination module 116. In one or more embodiments, the timing control module 118 may instruct the driver circuitry 112 to drive the light source 102 with the drive signal, e.g., the drive signal 120. For example, the timing control module 118 may provide the driver circuitry 112 with one or more of a frequency of the drive signal 120, a shape of the drive signal 120, amplitude of the drive signal 120, and an indication to begin and/or stop driving the light source 102 with the drive signal 120. Further, the timing control module 118 may be configured to generate the reset signal, e.g., the reset signal 122, and communicate the reset signal 122 to the receiver circuitry 114. The frequency of the reset signal 122 may be based on the frequency of the drive signal 120. For example, the frequency of the reset signal 122 may greater than the frequency of the drive signal 120. Further, the frequency of the reset signal 122 may be two or more times the frequency of the drive signal 120. In one embodiment, the frequency of the reset signal 122 is twice an odd sub-harmonic of the frequency of the drive signal 120. In other embodiments, other ratios between the frequencies the drive signal 120 and the reset signal 122 may be used. The timing control module 118 may be configured to provide the receiver circuity with a demodulation signal having frequency similar to that of the frequency of the drive signal. In one embodiment, the frequency of the demodulation signal is the same as the frequency of the drive signal.

Further, the drive signal, the reset signal and/or the demodulation signal may have a constant frequency or a variable frequency. In one embodiment, the excitation times of the drive signal may be variable. The length of the excitation times may be set such that the light source 102 and the amplifier circuitry of the receiver circuitry 114 coupled to the photodetector 104 are able to settle. Further, the demodulation signal may be a square wave, a sine wave, or any other signal type.

The driver circuitry 112, the receiver circuitry 114, the determination module 116, and the timing control module 118 may be part of the same (e.g., a single) integrated circuit (IC) chip. In other embodiments, one or more of the driver circuitry 112, the receiver circuitry 114, the determination module 116, and the timing control module 118 may be part of a first IC chip and a different one or more of the driver circuitry 112, the receiver circuitry 114, the determination module 116, and the timing control module 118 may be part of a second IC chip. Alternatively, each of the driver circuitry 112, the receiver circuitry 114, the determination module 116, and the timing control module 118 are part of separate IC chips. Further, in one embodiment, one or more elements of the driver circuitry 112, the receiver circuitry 114, the determination module 116, and the timing control module 118 may be distributed between multiple IC chips. For example, the driver circuitry 112 may include one or more current drivers that are disposed external to the IC chip that includes the main portion of the driver circuitry 112. Further, the receiver circuitry 114 may include one or more capacitors that are disposed external to the IC chip that includes at least the main portion of the receiver circuitry 114. Additionally, or alternatively, a first one or more portions of the receiver circuitry 114 may be disposed as part of a first IC chip and a second one or more portions of the receiver circuitry 114 may be disposed as part of a second IC chip. For example, a first amplifier circuitry may be disposed as part of a first IC chip and a second amplifier circuitry may be disposed as part of a second IC chip.

In one or more embodiments, the photodetector 104 is a photodiode and the processing system 110 is configured to operate the photodiode in one of a zero bias and a reverse bias configuration. For example, the receiver circuitry 114 may be configured to drive a cathode of the photodiode positive with respect to the anode of the photodiode to operate the photodiode in a reverse bias configuration. Further, the receiver circuitry 114 may be configured to drive a cathode of the photodiode at the same voltage with respect to the anode of the photodiode to operate the photodiode in a photovoltaic mode.

In one or more embodiments, the optical sensing device 100 is able to detect and measure light emitted by the light source 102 and reflected by the input object 130 in the presence of high amounts of ambient light. For example, the receiver circuitry 114 is configured to block ambient light as the receiver circuitry 114 is sensitive to current signals having fast rise and/or fall times and ambient light produces current signals having slow rise and/or fall times. In one or more embodiments, the optical sensing device 100 is configured to detect and measure light emitted by the light source 102 in the presence of full sunlight.

Figure 2:
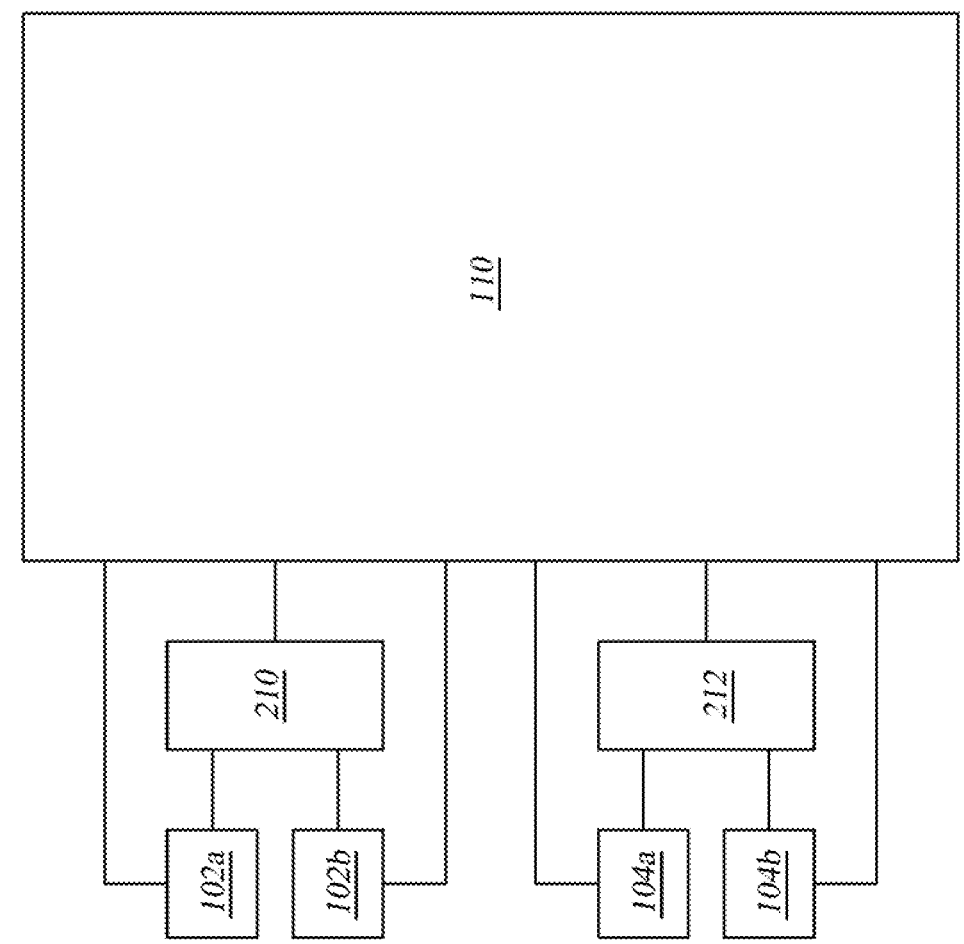
FIG. 2 is a schematic block diagram of an optical sensing device, according to one or more embodiments.

FIG. 2 is a schematic block diagram of an optical sensing device 200, according to one or more embodiments. The optical sensing device 200 may include multiple light sources, light sources 102a and 102b, multiple photodetectors, photodetectors 104a and 104b, and the processing system 110. While the embodiment of FIG. 2 illustrates two light sources 102a, 102b, in other embodiments, more than two light sources may be utilized. Further, while the embodiment of FIG. 2 illustrates two photodetectors 104a, 104b, in other embodiments, more than two photodetectors may be utilized. In one or more embodiments, the optical sensing device 200 includes the same number of light sources 102 and photodetectors 104. However, in other embodiments, the optical sensing device 200 includes more light sources 102 than photodetectors 104 or more photodetectors 104 than light sources 102.

The light sources 102a, 102b and the photodetectors 104a, 104b are coupled to the processing system 110. The processing system 110 may drive the light sources 102a, 102b with drive signals to cause the light sources 102a, 102b to emit light. Further, the processing system 110 may receive resulting signals with the photodetectors 104a, 104b. The resulting signals comprise effects corresponding to the light emitted by the light sources 102a, 102b.

In one embodiment, the light sources 102a, 102b are independently coupled to the processing system 110 and may be independently driven by the processing system 110. For example, the light sources 102a, 102b may be coupled to respective driver elements of the driver circuitry 112. Alternatively, the light sources 102a, 102b may be selectively coupled to the processing system 110 through a switching device 210. For example, the switching device 210 may be a multiplexer or one or more switches. Further, the light sources 102a, 102b may be coupled to the driver circuitry 112 via a different or the same switching device 210. In one or more embodiments, the switching device 210 may be internal or external to the processing system 110. In various embodiments, the driver circuitry 112 simultaneously drives the light sources 102a, 102b. In other embodiments, the driver circuitry 112 drives a first one of the light sources 102a, 102b during a first period and the other one of the light sources 102a, 102b during a second period that is non-overlapping with the first period.

In one or more embodiments, the photodetectors 104a, 104b may be independently coupled to the processing system 110. For example, each of the photodetectors 104a, 104b may be independently coupled to the receiver circuitry 114. Further, a respective resulting signal may be acquired by the receiver circuitry 114 from each of the photodetectors 104a, 104b during at least partially overlapping periods of time. Alternatively, a resulting signal may be simultaneously acquired by the receiver circuitry 114 from each of the photodetectors 104a, 104b. Further, the photodetectors 104a, 104b may be selectively coupled to the receiver circuitry 114 of the processing system 110 via a switching device 212. The switching device 212 may include one or more multiplexers or one or more switches. The switching device 212 may selectively couple the photodetectors 104a, 104b to the receiver circuitry 114. The switching device 212 may couple a first one of the photodetectors 104a, 104b to the receiver circuitry 114 during a first period to receive a first resulting signal and the other one of the photodetectors 104a, 104b during a second period non-overlapping with the first period to receive a second resulting signal. Alternatively, the switching device 212 may simultaneously couple the photodetectors 104a, 104b to receiver circuitry 114 to acquire a resulting signal that corresponds to the amount of light that is received from each photodetector 104a, 104b. Further, the switching device 210 may be internal or external to the processing system 110.

In one or more embodiments, the light sources 102a, 102b may be simultaneously driven with different drive signals. The drive signals may differ in frequency or may be based on different ones of a plurality of codes. The receiver circuitry 114 may receive a resulting signal from one of the photodetectors 104a, 104b that corresponds to the light emitted by both of the light sources 102a, 102b. Further, receiver circuitry 114 may include a first high pass filter that high-pass that filters the resulting signal to generate a first high-pass filtered signal, and a second high-pass filter that high-pass filters the resulting signal to generate a second high-pass filtered signal. The first high-pass filter may be reset corresponding to a reset signal according to the frequency or code associated with the drive signal driven on the light source 102a. Further, the second high pass may be reset corresponding to a reset signal according to the frequency or code associated with the drive signal driven on the light source 102b. Alternatively, the receiver circuitry 114 may include a high-pass filter that filters the resulting signal to generate a high-pass filtered signal and a first demodulator to demodulate the high-pass filtered signal according to a first demodulation signal and a second demodulator according to a second demodulation signal. The first demodulation signal may correspond to the frequency or code of the drive signal driven on the light source 102a, and the second demodulation signal may correspond to the frequency or code of the drive signal driven on the second light source 102b. Alternatively, the high-pass filtered signal may be converted from an analog domain to a digital domain via an ADC and digitally demodulated according to the first and second frequencies or codes.

Figure 3:
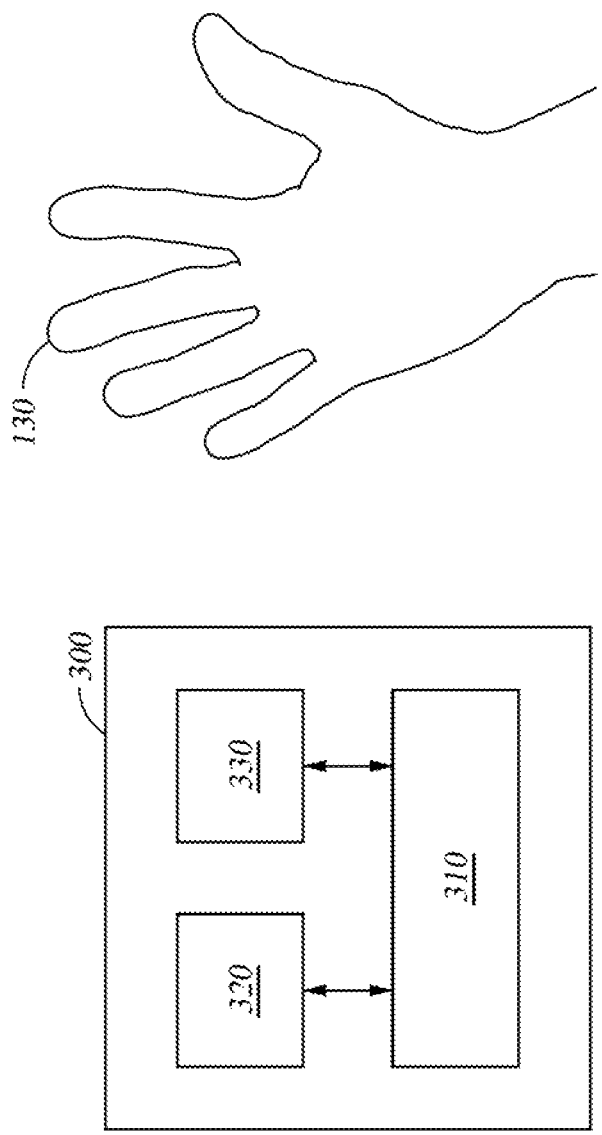
FIG. 3 is a schematic block diagram of an input device, according to one or more embodiments.

FIG. 3 is a schematic block diagram of an input device 300, according to one or more embodiments. In one embodiment, the input device 300 includes an optical sensing device 310, a display device 320 and/or an input sensing device 330. The optical sensing device 310 may be configured similar to that of the optical sensing device 100 or the optical sensing device 200. For example, the optical sensing device 310 may include one or more light sources 102 and one or more photodetectors 104, and the processing system 110.

In one embodiment, the optical sensing device 310 is configured to receive light emitted by the one or more light sources 102 and reflected by the input object 130 with the one or more photodetectors 104.

The display device 320 may include a display screen and may be configured to display one or more images. The display device 320 may be liquid crystal display (LCD) device or an OLED display device, among others.

The input sensing device 330 may be configured to detect the location of an input object, e.g., the input object 130, relative to the input device 300. For example, the input sensing device 330 may be configured to determine a one dimensional, two dimensional, and/or a three dimensional location of one or more portions of the input object 130 relative to the input device 300. In one or more embodiments, the input sensing device 330 may be a capacitive sensing device, an acoustic sensing device, and a resistive sensing device, among others.

The optical sensing device 310 may be coupled with the display device 320 and/or input sensing device 330. In one embodiment, the optical sensing device 310 is configured to alter a functionality of one or more elements of the input device 300 in response to the detection of the input object 130. For example, the optical sensing device 310 may be configured to determine one or more of a presence of the input object 130, a distance between the input object 130 and the input device 300 and motion of the input object 130 relative to the input object 130, and alter a functionality of one or more elements of the input device 300 based on the determination. In one embodiment, the functionality of one or more elements of the input device 300 is altered based on the input object 130 being within a threshold distance of the input device 300. For example, the threshold distance may be one or more centimeters or one or more decimeters.

In one or more embodiments, altering the functionality of one or more elements of the input device 300 includes altering a functionality of the display device 320 and/or a functionality of the input sensing device 330. In one embodiment, altering the functionality of the display device 320 includes turning off the display screen of the display device 320, turning on the display screen of the display device 320, and/or altering the brightness of the display screen of the display device 320. Further, altering the functionality of the input sensing device 330 may include turning on the input sensing device 330, turning off the input sensing device 330, changing a sensing mode of the input sensing device 330, placing the input sensing device 330 in a low power mode, removing the input sensing device 330 from the lower power mode, and/or altering a sensing frequency or one or more other sensing parameters of the input sensing device 330.

In various embodiments, the optical sensing device 310, the display device 320, and the input sensing device 330 are coupled to a common processing system, e.g., the processing system 110. In other embodiments, at least two of the optical sensing device 310, the display device 320, and the input sensing device 330 are coupled to a common processing system. Further, in one or more embodiments, the optical sensing device 310, the display device 320, and the input sensing device 330 are coupled to different processing systems.

In one embodiment, a frequency of the drive signal, e.g., the drive signal 120, corresponds to a frequency of a sensing signal utilized by the input sensing device 330. Further, in one or more embodiments, in response to changing the frequency of the sensing signal, the frequency of the drive signal 120 is changed. For example, if the frequency of the sensing signal utilized by the input sensing device 330 is changed from 200 kHz to 300 kHz, the frequency of the drive signal is changed from 200 kHz to 300 kHz.

Figure 4:
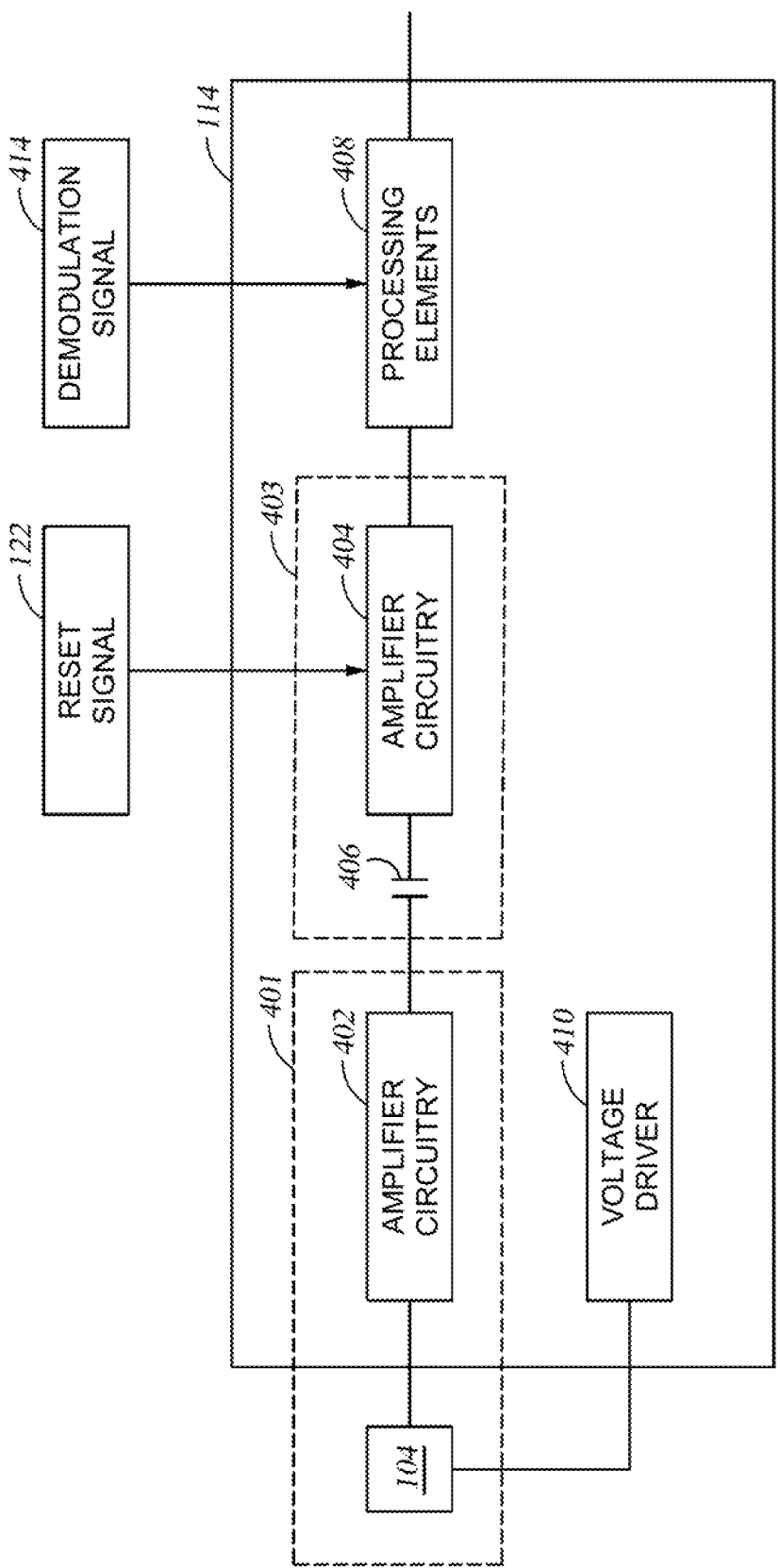
FIGS. 4, 5, and 6 are schematic block diagrams of receiver circuitry, according to one or more embodiments.

FIG. 4 is a block diagram of the receiver circuitry 114, according to one or more embodiments. As illustrated in the embodiment of FIG. 4, the receiver circuitry 114 includes photodetector circuitry 401, high-pass filter circuitry 403, processing elements 408, and a photodetector bias voltage driver 410. The photodetector bias voltage driver 410 is configured to drive the photodetector 104 with a reverse bias or zero bias voltage.

The photodetector circuitry 401 includes photodetector 104 and amplifier circuitry 402. The photodetector 104 is coupled to an input of the amplifier circuitry 402. In various embodiments, the amplifier circuitry 402 may be referred to as a transimpedance amplifier. Further, the photodetector circuitry 401 may be referred to as voltage output photodetector circuitry.

The high-pass filter circuitry 403 includes capacitor 406 and the amplifier circuitry 404. In one embodiment, the capacitor 406 may be referred to as an input capacitor as it is coupled between an output of the amplifier circuitry 402 and an input of the amplifier circuitry 404. Further, the amplifier circuitry 404 is coupled to the processing elements 408. In one embodiment, the amplifier circuitry 404 includes a reset switch, e.g., reset switch 515 of FIG. 5, and the high-pass filter circuitry 403 may be referred to as a switched capacitor integrator circuit.

The amplifier circuitry 402 is configured to receive a resulting signal from the photodetector 104 and generate a voltage signal. The voltage signal generated by the amplifier circuitry 402 is high pass filtered by the high-pass filter circuitry 403 to generate a high-pass filtered signal. In embodiments where the received light is inband, e.g., at about half of the frequency of the reset signal, the voltage level of the voltage signal corresponds to the amount of light received by the photodetector 104.

In one or more embodiments, the high-pass filter circuitry 403 has zero response at even harmonics of the frequency of the drive signal 120 and maximum response at odd harmonics of the frequency of the drive signal 120.

The amplifier circuitry 404 may receive the reset signal 122 from the timing control module 118. The reset signal 122 may control one or more switches of the amplifier circuitry to reset a feedback capacitor of the amplifier circuitry 404. For example, the reset signal 122 may control the reset switch 515 of FIG. 5.

The amplifier circuitry 404 is coupled to the processing elements 408. The processing elements 408 are configured to apply one or more signal processing techniques to the high pass filtered signal to generate a processed signal. For example, the processing elements 408 may be configured to demodulate and low pass filter the voltage signal to generate a processed signal. In one embodiment, the processing elements 408 include one of a discrete time or a continuous time demodulator. Further, the processing elements 408 may be configured to convert the high pass filtered signal from an analog domain to a digital domain, generating a digital signal. The processing elements 408 may be coupled to the determination module 116 and configured to provide the processed signal or the digital signal to the determination module 116.

In one or more embodiments, the amplifier circuitry 402, the amplifier circuitry 404, and the processing elements 408 are part of a first IC chip. In other embodiments, one or more of the amplifier circuitry 402, the amplifier circuitry 404, and the processing the processing elements 408 is part of a first IC chip and a different one or more of the amplifier circuitry 402, the amplifier circuitry 404, and the processing elements 408 is part of a second IC chip. For example, the amplifier circuitry 402 may be part of a first IC chip and the amplifier circuitry 404 and the processing elements 408 may be part of a second IC chip. Further, the capacitor 406 may be disposed within an IC chip comprising the amplifier circuitry 404 or external to the IC chip.

Figure 5:
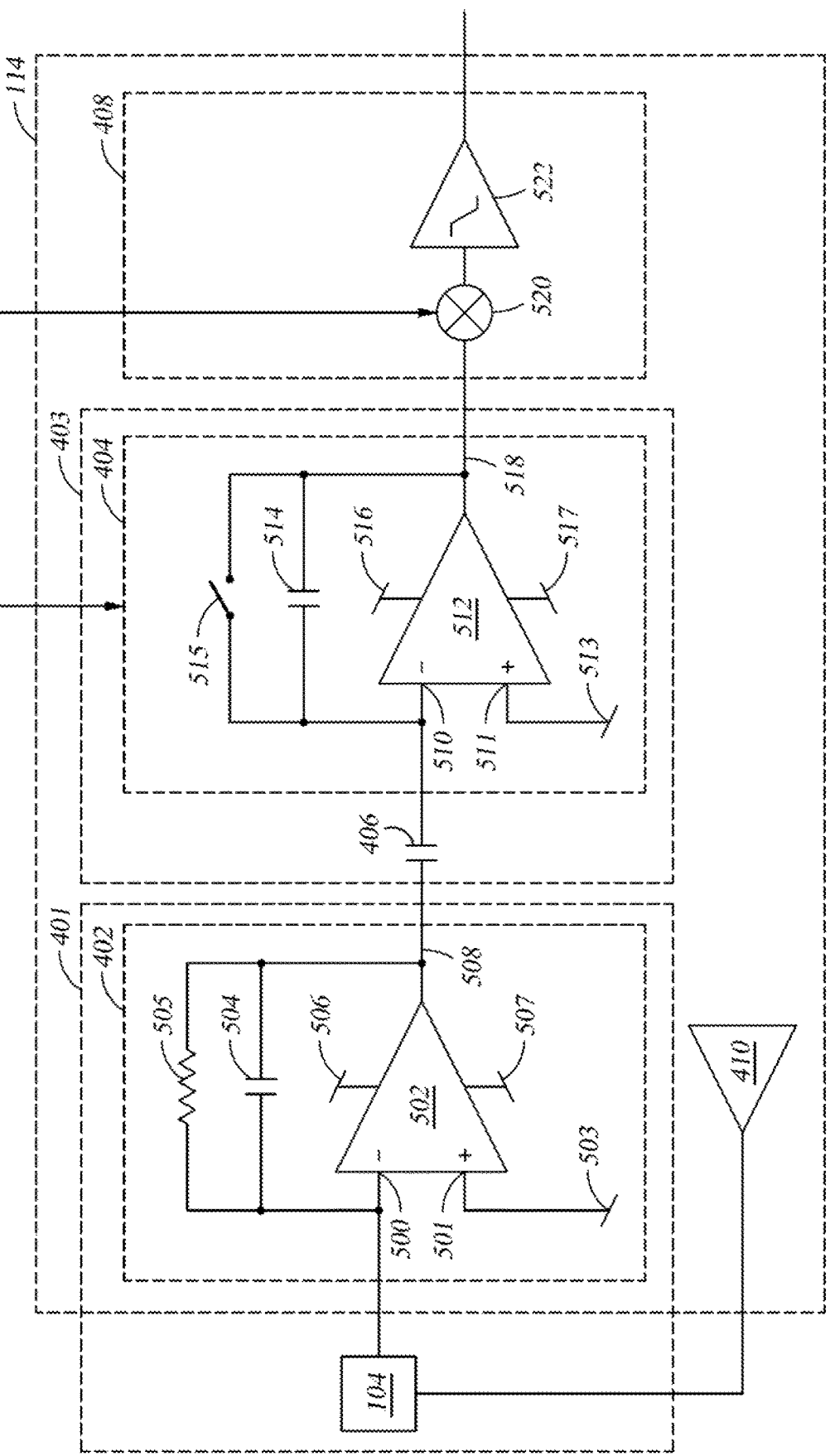

FIG. 5 illustrates a schematic block diagram the receiver circuitry 114, according to one or more embodiments. As illustrated in FIG. 5, the amplifier circuitry 402 includes an amplifier 502, a feedback resistor 505, and an optional feedback capacitor 504. Further, an inverting input 500 of the amplifier 502 is coupled to the photodetector 104 and a non-inverting input 501 of the amplifier 502 is coupled to a voltage reference 503. The optional feedback capacitor 504 may be included to reduce gain peaking due to parasitic capacitance on the photodetector 104. Further, the amplifier circuitry 402 is coupled to a high power supply voltage 506 and a low power supply voltage 507. In one embodiment, the voltage value of the low power supply voltage 507 is less than the voltage value of the high power supply voltage 506. For example, the voltage value of the high power supply voltage 506 may be about 3.3 V and the low power supply voltage 507 may be about 0 V. In other embodiments, other voltage values may be utilized. In one embodiment, an inductor may be utilized in addition to feedback resistor 505. For example, an inductor may be placed in parallel with the feedback resistor 505, reducing the DC gain of the amplifier circuitry 402 to be at least near zero.

In one or more embodiments, the voltage reference 503 may be similar to the low power supply voltage 507. For example, in one embodiment, the voltage reference 503 is the same as the low power supply voltage 507. Alternatively, the value of the voltage reference 503 may be greater than the low power supply voltage 507. For example, the value of the voltage reference 503 may be about 50 mV to 1V above the value of the low power supply voltage 507. However, in other embodiments, other offsets may be utilized. In various embodiments, the resistance value of the feedback resistor 505 prevents the amplifier circuitry 402 from saturating in the presence of bright ambient light, such as full sunlight or a strong ambient light source. For example, the resistance value of the feedback resistor 505 prevents the amplifier circuitry 402 from saturating in the presence of black body radiation at 5800 K and 1400 Watt per square meter irradiance. In one embodiment, the resistance value of the feedback resistor 505 is further based on the difference between the value of the high power supply voltage 506, the value of voltage reference 503, the full sunlight current of the photodetector 104, and the output compliance of the amplifier 502. For example, the resistance value of the feedback resistor 505 may be in a range of about 1 kilo ohms to about 10 kilo ohms. In other embodiments, resistance values below about 1 kilo ohms and above 10 kilo ohms may be utilized.

The high-pass filter circuitry 403 includes capacitor 406 coupled to the output 508 of the amplifier 502 and to an inverting input 510 of the amplifier 512. In one embodiment, the value of the capacitor 406 is configured to maintain the input to the amplifier 512 below a saturation value of the amplifier 512. For example, the value of the capacitor 406 may be in a range of about 1 pf to about 10 pf. In other embodiments, the value of the capacitor 406 may be less than about 1 pf or above about 10 pf.

The amplifier circuitry 404 includes the amplifier 512, a feedback capacitor 514, and the reset switch 515. The amplifier 512 is coupled to a low power supply voltage 517 and to a high power supply voltage 516, and the non-inverting input 511 is coupled to a voltage reference 513. The value of the low power supply voltage 517 may be less than the value of the high power supply voltage 516. In one embodiment, the value of the low power supply voltage 517 is about 0 V and the value of the high power supply voltage 516 is about 3.3 V. In other embodiments, other voltage values may be utilized. The voltage reference 513 and the voltage reference 503 may be the same reference voltage. Further, high power supply voltage 516 may be the same as high power supply voltage 506 and the low power supply voltage 517 may be the same as low power supply voltage 507. In one or more embodiments, the amplifier circuitry 404 and the capacitor 406 may be referred to as a switched capacitor high-pass filter or a tunable high-pass filter.

In various embodiments, the value of the feedback capacitor 514 is in a range of about 10 pf to about 50 pf. In other embodiments, the value of the feedback capacitor 514 may be less than about 10 pf or greater than about 50 pf.

In one or more embodiments, the reset switch 515 is selectively operated (e.g., controlled) by the reset signal 122 provided by the timing control module 118. The reset signal 122 may control the timing during which the reset switch 515 is an opened position or a closed position, controlling the integration timing of the amplifier circuitry 404. For example, the reset switch 515 is placed in the closed position when the reset signal 122 is high and in an opened position when the reset signal 122 is low. In one embodiment, the timing between falling edges and rising edges of the reset signal 122 corresponds to the integration time of the amplifier circuitry 404. Further, the reset switch 515 may be configured to open and close before each rising edge of the drive signal 120 and before each falling edge of the drive signal 120.

An output 518 of the amplifier 512 is coupled to an input of the demodulator 520 of the processing elements 408. The demodulator 520 mixes the voltage signal generated output by the amplifier 512 with a demodulation signal 414 to generate a demodulated high-pass filtered signal. The demodulated high-pass filtered signal is provided to the low pass filter 522, where the demodulated voltage signal is filtered to generate a processed voltage signal.

Figure 6:
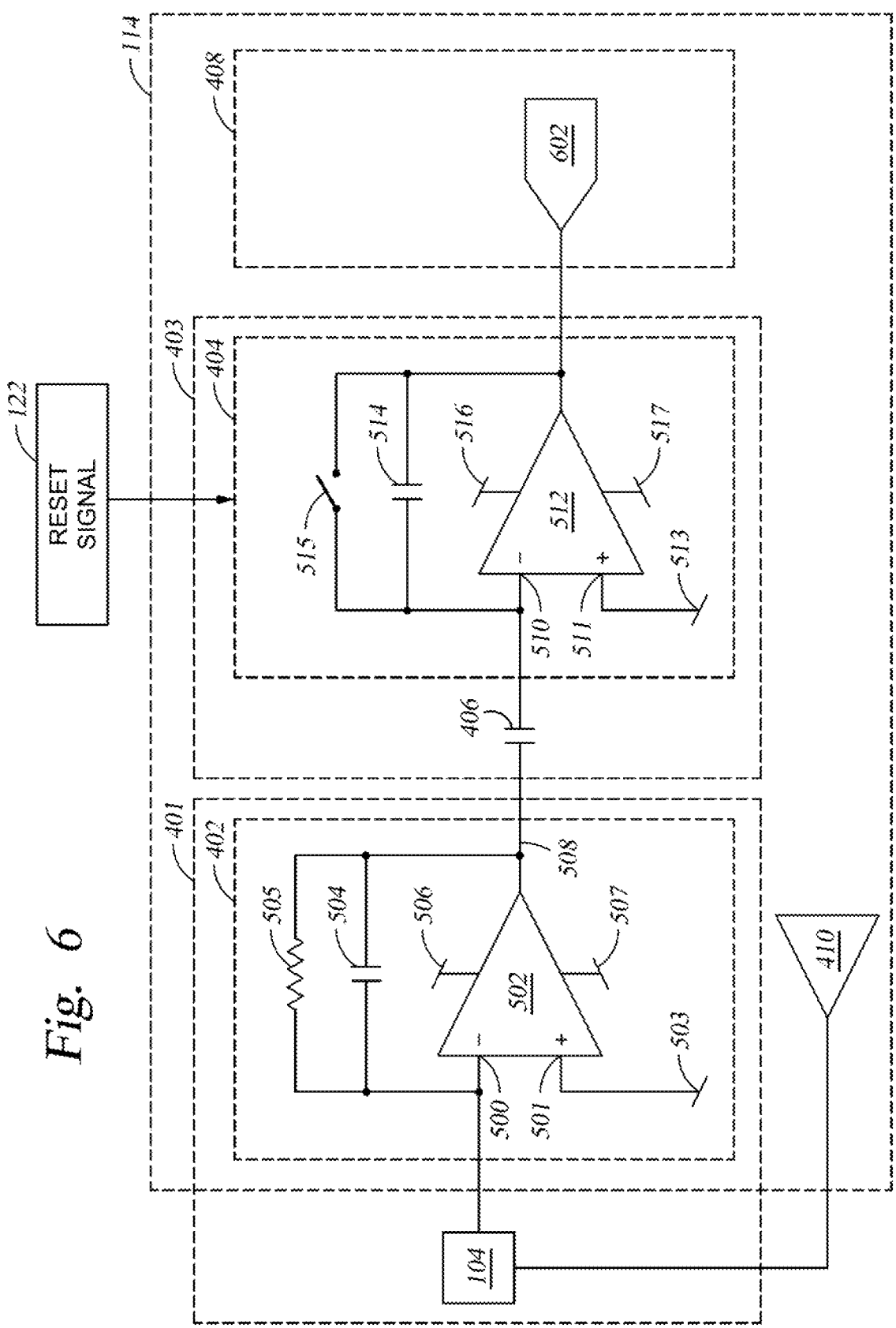

FIG. 6 illustrates a schematic block diagram of the receiver circuitry 114, according to one or more embodiments. In the embodiment of FIG. 6, the receiver circuitry 114 includes the photodetector circuitry 401 and the high-pass filter circuitry 403 as described with regard to the embodiment of FIG. 5. However, as compared to the embodiment of FIG. 5, the processing elements 408 include an ADC 602 instead of the demodulator 520 and the low pass filter 522. The ADC 602 converts the high-pass filtered signal received from the output 518 of the amplifier circuitry 404 from an analog domain to a digital domain, generating a digital high-pass filtered signal. In one embodiment, the ADC 602 may sample the high-[pass filtered signal just before a pulse of the reset signal 122 and before the feedback capacitor 514 is reset. In one embodiment, the digital high-pass filtered signal may be provided to the determination module 116 and the determination module 116 may demodulate the digital resulting signal using the demodulation signal 414 provided by the timing control module 118. For example, an algorithm such as a Fast Fourier Transform (FFT) algorithm or a Goertzel algorithm, among others, may be utilized by the determination module 116. In another embodiment, the high-pass filtered signal may be demodulated by the demodulator, e.g., demodulator 520, before it is converted by the ADC 602.

Figure 7:
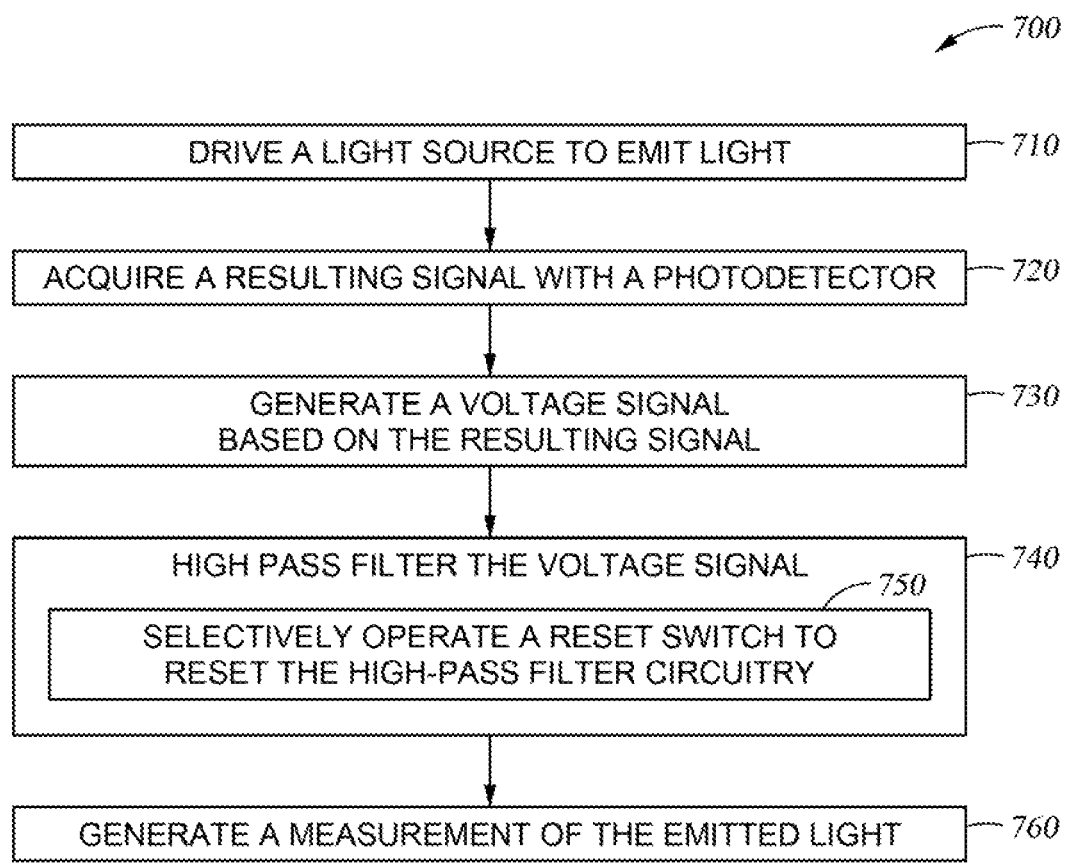
FIG. 7 is a flow diagram of a method for sensing light, according to one or more embodiments.

FIG. 7 is a flow diagram of a method 700 for sensing emitted light, according to one or more embodiments. At operation 710, light is emitted with a light source. For example, the light source 102 may be driven by the driver circuitry 112 with the drive signal 120 to emit light.

At operation 720, a resulting signal is acquired from a photodetector. In one embodiment, the amplifier circuitry 402 of the processing system 110 acquires a resulting signal from the photodetector 104. The resulting signal corresponds to light emitted by the light source 102 and reflected by the input object 130. Further, in one or more embodiments, the resulting signal comprising effects corresponding to ambient light.

At operation 730, a voltage signal is generated based on the resulting signal. For example, the amplifier circuitry 402 generates a voltage signal based on the resulting signal. At operation 740, the voltage signal is high pass filtered to generate a high-pass filtered signal. For example, the high-pass filter circuitry 403 generates a high-pass filtered signal from the voltage signal.

In one embodiment, high-pass filtering the voltage signal comprises selectively operating a reset switch 515 of the high-pass filter circuitry 403 to reset the feedback capacitor 514 of the high-pass filter circuitry 403 (operation 750). For example, the high-pass filter circuitry 403 may receive the reset signal 122 which is utilized to operate the reset switch 515. The reset signal 122 may be provided by the timing control module 118. In one embodiment, the reset signal 122 has a frequency greater than a frequency of the drive signal 120. For example, the frequency of the reset signal 122 may be at least two times the frequency of the drive signal 120. Further, the frequency of the reset signal 122 may be twice an odd sub-harmonic of the frequency of the drive signal 120. In one embodiment, the reset switch 515 may be closed in response to each rising edge of the reset signal 122 and opened in response to each falling edge of the reset signal 122 to reset the feedback capacitor 514. In one embodiment, the reset switch 515 is operated to reset the feedback capacitor 514 before each rising edge and/or falling edge of the drive signal 120.

At operation 760, a measurement of the received light is generated. For example, the high-pass filtered signal may be provided to the determination module 116, and the determination module 116 is configured to generate a measurement of the received light based on the high-pass filtered signal. In one embodiment, the high-pass filtered signal is demodulated by the demodulator 520 and filtered by the low pass filter 522 before being output to the determination module 116. In other embodiments, the high-pass filtered signal is converted from an analog domain to a voltage domain before being output to the determination module 116. In such embodiments, the determination module 116 is configured to demodulate and filter the digital high-pass filtered signal to generate a processed signal.

The determination module 116 may track and remove a baseline from the processed voltage signal. Further, the determination module 116 may compare the voltage signal to one or more thresholds to determine presence of the input object 130, or lack thereof. In one or more embodiment, the determination module 116 is configured to determine the location or movement of an input object 130, relative to an input device, e.g., the input device 300.

In one or more embodiments, the determination module 116 may provide an indication to one or more elements of an input device, e.g., the input device 300, to alter a parameter of the one or more elements. For example, the determination module 116 may provide an indication to a display device, e.g., display device 320, to alter a brightness level, to turn on or to turn off. Further, the determination module 116 may provide an indication to an input sensing device, e.g., the input sensing device 330, to alter one or more operating modes or operating parameters of the input sensing device.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

What is claimed is:

1. A processing system for an optical sensing device, the processing system comprising:
   receiver circuitry configured to acquire a resulting signal with a photodetector, the resulting signal corresponding to light emitted by a light source in response to being driven with a drive signal, wherein the receiver circuitry comprises:
      high-pass filter circuitry having an input and an output, the high-pass filter circuitry configured to generate a high-pass filtered signal based on the resulting signal, the high-pass filter circuitry comprising:
         an input capacitor coupled to the input;
         a first feedback capacitor coupled between the input and output; and
         a reset switch configured to reset the first feedback capacitor at least partially based on a reset signal having a frequency corresponding to a frequency of the drive signal; and
   a determination module configured to generate a first light measurement based on the high-pass filtered signal.

2. The processing system of claim 1 further comprising:
   driver circuitry coupled to the light source and configured to drive the light source with the drive signal.

3. The processing system of claim 1, wherein resetting the first feedback capacitor at least partially based on the reset signal comprises resetting the first feedback capacitor before at least one of each rising edge and each falling edge of the drive signal.

4. The processing system of claim 1, wherein the frequency of the reset signal is at least two times the frequency of the drive signal.

5. The processing system of claim 1, wherein the frequency of the reset signal is at least two times an odd sub-harmonic of the frequency of the drive signal.

6. The processing system of claim 1, wherein the receiver circuitry further comprises:
   a demodulator comprising an input coupled to the output of the high-pass filter circuitry, the demodulator is configured to demodulate the high-pass filtered signal based on a demodulation signal having a frequency corresponding to the frequency of the drive signal; and
   a low pass filter coupled to an output of the demodulator and configured to filter the demodulated high-pass filtered signal.

7. The processing system of claim 1, wherein the receiver circuitry further comprises first amplifier circuitry comprising:
   a second feedback resistor; and
   an amplifier having an input coupled to the photodetector and an output coupled to the input capacitor.

8. The processing system of claim 1, wherein the receiver circuitry further comprises:
   an analog-to-digital converter (ADC) coupled to an output of the high-pass filter circuitry and configured to generate a digital high-pass filtered signal from the high-pass filtered signal.

9. A method for operating an optical sensor, the method comprising:
   acquiring, from a photodetector, a resulting signal corresponding to light emitted by a light source in response to being driven with a drive signal;
   high-pass filtering, with high-pass filter circuitry, a voltage signal corresponding to the resulting signal to generate a high-pass filtered signal by selectively operating a reset switch to reset a feedback capacitor of the high-pass filter circuitry at least partially based on a reset signal, wherein the feedback capacitor is coupled between an input of the high-pass filter circuitry and an output of the high-pass filter circuitry, and wherein the reset signal has a frequency corresponding to a frequency of the drive signal; and
   generating a measurement of light based on the high-pass filtered signal.

10. The method of claim 9, further comprising:
    driving the light source with the drive signal to emit light.

11. The method of claim 9, wherein selectively operating the reset switch to reset the feedback capacitor comprises selectively operating the reset switch based on at least one of each rising edge and each falling edge of the drive signal.

12. The method of claim 9, wherein the frequency of the reset signal is at least two times the frequency of the drive signal.

13. The method of claim 9, wherein the frequency of the reset signal is at least two times an odd sub-harmonic of the frequency of the drive signal.

14. The method of claim 9 further comprising demodulating the high-pass filtered signal based on a demodulation signal comprising a frequency corresponding to the frequency of the drive signal.

15. An optical sensing device comprising:
a light source;
a photodetector; and
a processing system coupled the light source and the photodetector, the processing system comprising:
  driver circuitry configured to drive the light source with a drive signal to emit light;
  receiver circuitry configured to acquire a resulting signal from the photodetector, the resulting signal corresponding to the light emitted by the light source, wherein the receiver circuitry comprises:
  high-pass filter circuitry having an input and an output, the high-pass filter circuitry configured to generate a high-pass filtered signal based on the resulting signal, the high-pass filter circuitry comprising:
    an input capacitor coupled to the input;
    a first feedback capacitor coupled between the input and output; and
    a reset switch configured to reset the first feedback capacitor at least partially based on a reset signal having a frequency greater than a frequency of the drive signal; and
  a determination module configured to generate a light measurement based on the high-pass filtered signal.

16. The optical sensing device of claim 15, wherein resetting the first feedback capacitor comprises resetting first the feedback capacitor before at least one of each rising edge and each falling edge of the drive signal.

17. The optical sensing device of claim 15, wherein the frequency of the reset signal is at least twice the frequency of the drive signal.

18. The optical sensing device of claim 15, wherein the frequency of the reset signal is at least two times an odd subharmonic of the frequency of the drive signal.

19. The optical sensing device of claim 15, wherein the receiver circuitry further comprises first amplifier circuitry comprising:
a second feedback resistor; and
an amplifier having an input coupled to the photodetector and an output coupled to the input capacitor.

20. The optical sensing device of claim 15, wherein the receiver circuitry further comprises:
a demodulator comprising an input coupled to the output of the high-pass filter circuitry, the demodulator is configured to demodulate the high-pass filtered signal based on a demodulation signal comprising a frequency corresponding to the frequency of the drive signal; and
a low pass filter coupled to an output of the demodulator and configured to filter the demodulated high-pass filtered signal.

\* \* \* \* \*